(12) United States Patent
Hayakawa et al.

(10) Patent No.: US 11,462,886 B2
(45) Date of Patent: Oct. 4, 2022

(54) BURIED-TYPE SEMICONDUCTOR OPTICAL DEVICE

(71) Applicant: Lumentum Japan, Inc., Kanagawa (JP)

(72) Inventors: Shigenori Hayakawa, Tokyo (JP); Hironori Sakamoto, Kanagawa (JP); Shunya Yamauchi, Kanagawa (JP); Yoshihiro Nakai, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 173 days.

(21) Appl. No.: 16/845,223

(22) Filed: Apr. 10, 2020

(65) Prior Publication Data

US 2021/0044083 A1 Feb. 11, 2021

(30) Foreign Application Priority Data

Aug. 9, 2019 (JP) .............................. JP2019-147475
Nov. 13, 2019 (JP) .............................. JP2019-205491

(51) Int. Cl.
*H01S 5/22* (2006.01)
*H01S 5/343* (2006.01)
(Continued)

(52) U.S. Cl.
CPC .......... *H01S 5/2224* (2013.01); *H01S 5/0265* (2013.01); *H01S 5/04256* (2019.08);
(Continued)

(58) Field of Classification Search
CPC . H01S 5/227–2277; H01S 5/2205–221; H01S 5/2222; H01S 5/2224–2228
See application file for complete search history.

(56) References Cited

U.S. PATENT DOCUMENTS 4,408,330 A * 10/1983 An ...................... H01L 33/0041
257/E33.053
5,148,439 A * 9/1992 Wunstel .................. H01S 5/227
372/45.01
(Continued)

FOREIGN PATENT DOCUMENTS

JP 2013-061632 A 1/2012
JP 2012-019053 A 4/2013

*Primary Examiner* — Sean P Hagan
(74) *Attorney, Agent, or Firm* — Harrity & Harrity, LLP

(57) ABSTRACT

A buried semiconductor optical device comprises a semiconductor substrate; a mesa-stripe portion including a multi-quantum well layer on the semiconductor substrate; a buried layer consisting of a first portion and a second portion, the first portion covering one side of the mesa-stripe portion, the second portion covering the other side of the mesa-stripe portion, and the first portion and the second portion covering a surface of the semiconductor substrate; and an electrode configured to cause an electric current to flow through the mesa-stripe portion, the buried layer comprising, from the surface, a first, second, and third sublayer, the first and third sublayer each consisting of semi-insulating InP, the first sublayer and the second sublayer forming a pair structure, the second sublayer being located above the multi-quantum well layer, and the second sublayer consisting of one or more layers selected from InGaAs, InAlAs, InGaAlAs, InGaAsP, and InAlAsP.

12 Claims, 10 Drawing Sheets

(51) Int. Cl.
*H01S 5/026* (2006.01)
*H01S 5/227* (2006.01)
*H01S 5/042* (2006.01)
*H01S 5/125* (2006.01)

(52) U.S. Cl.
CPC .......... *H01S 5/2226* (2013.01); *H01S 5/2227* (2013.01); *H01S 5/2275* (2013.01); *H01S 5/3434* (2013.01); *H01S 5/125* (2013.01)

(56) References Cited

U.S. PATENT DOCUMENTS

| | | | | |
|---|---|---|---|---|
| 5,717,710 | A * | 2/1998 | Miyazaki | H01S 5/0265 372/50.1 |
| 5,847,415 | A * | 12/1998 | Sakata | B82Y 20/00 257/96 |
| 2003/0214990 | A1* | 11/2003 | Kadowaki | H01S 5/0265 372/46.01 |
| 2011/0090928 | A1* | 4/2011 | Kaida | H01S 5/227 372/46.012 |
| 2012/0008895 | A1 | 1/2012 | Sumi et al. | |
| 2013/0051725 | A1 | 2/2013 | Shinoda et al. | |
| 2013/0208751 | A1* | 8/2013 | Nakahara | H01S 5/2201 372/45.011 |
| 2013/0336350 | A1* | 12/2013 | Nakamura | H01S 5/2226 372/46.01 |
| 2016/0126701 | A1* | 5/2016 | Okuda | H01S 5/2272 438/45 |
| 2017/0373473 | A1* | 12/2017 | Bismuto | H01S 5/2209 |

* cited by examiner

BURIED-TYPE SEMICONDUCTOR OPTICAL DEVICE

CROSS-REFERENCE TO RELATED APPLICATIONS

The present application claims priority from Japanese applications JP 2019-147475, filed on Aug. 9, 2019, and JP 2019-205491, filed on Nov. 13, 2019, the contents of which are hereby incorporated by reference into this application.

TECHNICAL FIELD

The present disclosure relates to a buried semiconductor optical device.

BACKGROUND

Recently, as a telecommunication device, such as a mobile phone, and the internet have become popular, an optical transceiver module is required to achieve higher transmission rate and larger transmission size. An Electro-Absorption (EA) Modulator is used for modulating a continuous wave light emitted from an oscillator. The EA modulator is widely used because the EA modulator is small-sized and low-cost as well as reduces chirp (wavelength modulation), achieves high extinction ratio representing the difference between ON level and OFF level of an optical signal, and has a high modulation bandwidth.

A semiconductor optical device may be integrated with an EA modulator including a buried heterostructure (BH structure). The BH structure may comprise a mesa-stripe structure of multilayers (an active layer included) and semi-insulating semiconductor layers between which the mesa-stripe structure is sandwiched laterally.

A 1.3, 1.55 um semiconductor optical device with a buried layer for optical telecommunications is InP-based. The buried layer is a semi-insulating InP doped with impurities like iron (Fe). For improving properties of the EA modulator, it may be important to achieve a higher modulation bandwidth. One way to achieve the higher modulation bandwidth is to reduce a parasitic capacitance of the EA modulator, for example. Increase of thicknesses of the buried layer of the mesa-stripe structure or a height of the mesa-stripe structure may reduce the parasitic capacitance. A semiconductor heterostructure may comprise a mesa-stripe structure and a buried semiconductor layer in which the mesa-stripe structure is buried and the buried semiconductor layer is higher than the mesa-stripe structure. However, the buried semiconductor layer may be significantly thicker than other layers in the semiconductor heterostructure. Many foreign bodies may be generated over a surface of a wafer including the surface of the EA modulator.

For improving fast response of the EA modulator, ruthenium (Ru) can be added to the buried semiconductor layer as an impurity. This is because the buried semiconductor layer doped with Ru suppresses diffusion of dopants like zinc (Zn) in a p-type cladding layer of the EA modulator into the buried semiconductor layer and to reduce parasitic capacitance of the buried semiconductor layer.

However, doping Ru into the buried semiconductor layer increases the number of the foreign bodies. FIG. 1 schematically shows a plan view of foreign bodies and associated cracks. FIG. 2 schematically illustrates a cross-section of the foreign bodies and the buried semiconductor optical device along a I-I line with composition of the foreign bodies and the buried semiconductor optical device obtained with an electron microscope. The foreign bodies persist as protrusion on the surface of the buried semiconductor optical device, which generates disorder of a crystalline plane of the buried semiconductor optical device. A batch of the buried semiconductor optical devices 10 is fabricated on the wafer one time. After that, the batch is cleaved such that the batch is divided into individual devices. The batch is preferably cleaved such that each device has an exit edge face and its opposite edge face parallel to the exit edge face. However, the foreign body 1 disturbs normal cleavage, resulting in abnormal cleavage such as cleavage lines 2, which divide the batch unintentionally.

Many of the foreign bodies may include the respective indium (In) cores from the electron microscope image and compositional analysis of the foreign bodies shown in FIG. 2 for the first time. This is attributed to the fact that the buried semiconductor layer doped with ruthenium (Ru) is deposited at low temperature and low V/III ratio. The low temperature deposition reduces migration of In over the surface of the substrate. The low V/III ratio deposition reduces supply of P, and thus increases an amount of unreacted In. As a result, the In core may be prone to form.

SUMMARY

According to some possible implementations, a buried semiconductor optical device comprises a semiconductor substrate; a mesa-stripe portion including a multi-quantum well layer on the semiconductor substrate; a buried layer consisting of a first portion and a second portion, the first portion covering one side of the mesa-stripe portion, the second portion covering the other side of the mesa-stripe portion, and the first portion and the second portion covering a surface of the semiconductor substrate; and an electrode configured to cause an electric current to flow through the mesa-stripe portion, the buried layer comprising, from the surface of the semiconductor substrate, a first sublayer, a second sublayer, and a third sublayer, the first sublayer, the second sublayer, and the third sublayer each consisting of semi-insulating InP, the first sublayer and the second sublayer forming a pair structure, the second sublayer being located above the multi-quantum well layer from the surface of the semiconductor substrate, and the second sublayer consisting of one or more layers selected from a group of InGaAs, InAlAs, InGaAlAs, InGaAsP, and InAlAsP.

DETAILED DESCRIPTION

The following detailed description of example implementations refers to the accompanying drawings. The same reference numbers in different drawings may identify the same or similar elements.

Figure 3:
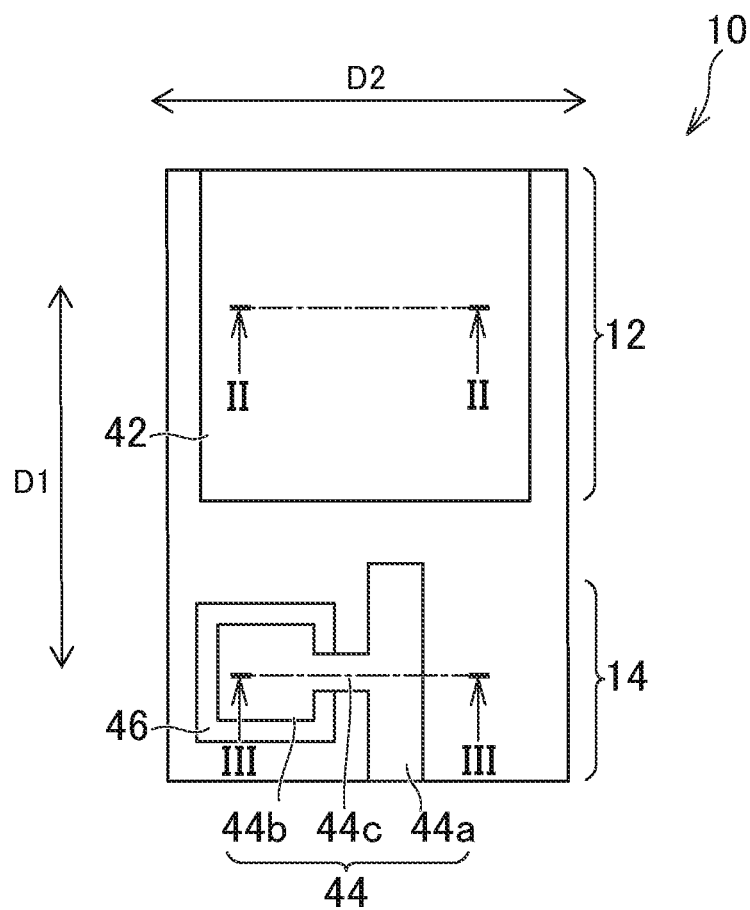
FIG. 3 shows a plan view of a buried semiconductor optical device according to a first example.

FIG. 3 shows a plan view of a buried semiconductor optical device according to an implementation. A buried semiconductor optical device 10 comprises a semiconductor substrate 16, and an oscillator 12 and a modulator 14 monolithically integrated on the semiconductor substrate 16. The buried semiconductor optical device 10 is, for example, a semiconductor optical device integrated with a modulator such as a modulator integrated laser device. The oscillator 12 may be, for example, a semiconductor laser device such as Distributed Feedback (DFB) laser. The modulator 14 may be an Electro-Absorption (EA) modulator.

The oscillator 12 is configured to emit a continuous waveform (CW) light by injecting a driving current. The modulator 14 is configured to modulate the CW light to output a signal light.

The EA modulator reduces chirp (wavelength modulation), achieves high extinction ratio representing the difference between ON level and OFF level of the signal light, and has a high modulation bandwidth. In addition to the abovementioned, the EA modulator is small-sized and low-cost. Thus, the EA modulator is widely used. According to some implementations, the length of the EA modulator is 100 mm.

The buried semiconductor optical device 10 is a DFB laser device integrated with EA modulator. The DFB laser device integrated with EA modulator is used for optical transmission at 1.55 μm bandwidth with transmission rate of 40 Gbps, or at 1.3 μm bandwidth with transmission rate of 56 or 106 Gbps for example.

Figure 4A:
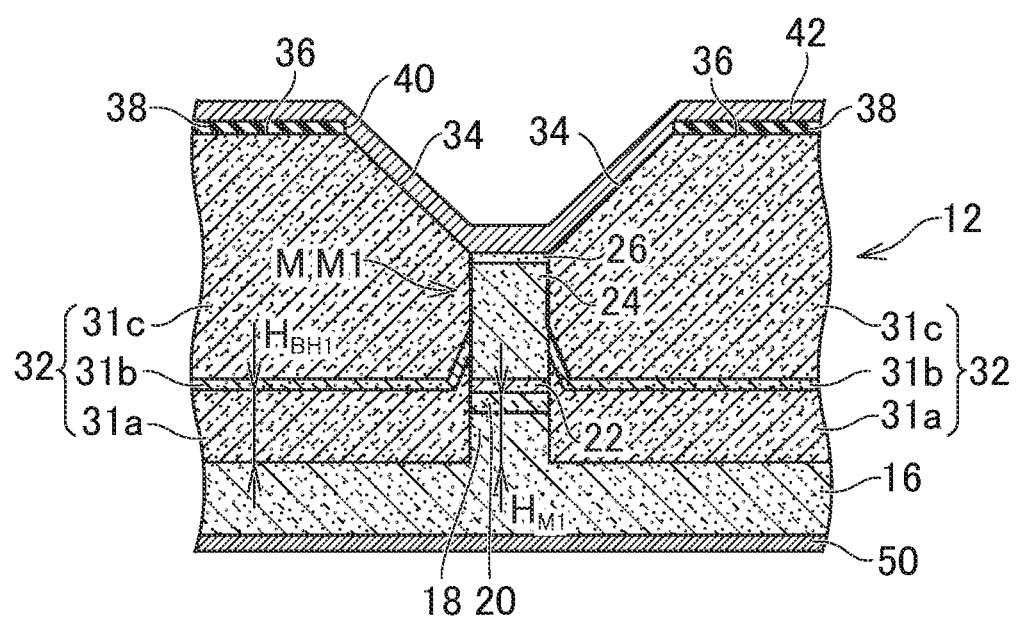
FIG. 4A shows a cross sectional view of a buried semiconductor optical device according to the first example along a II-II line.
Figure 4B:
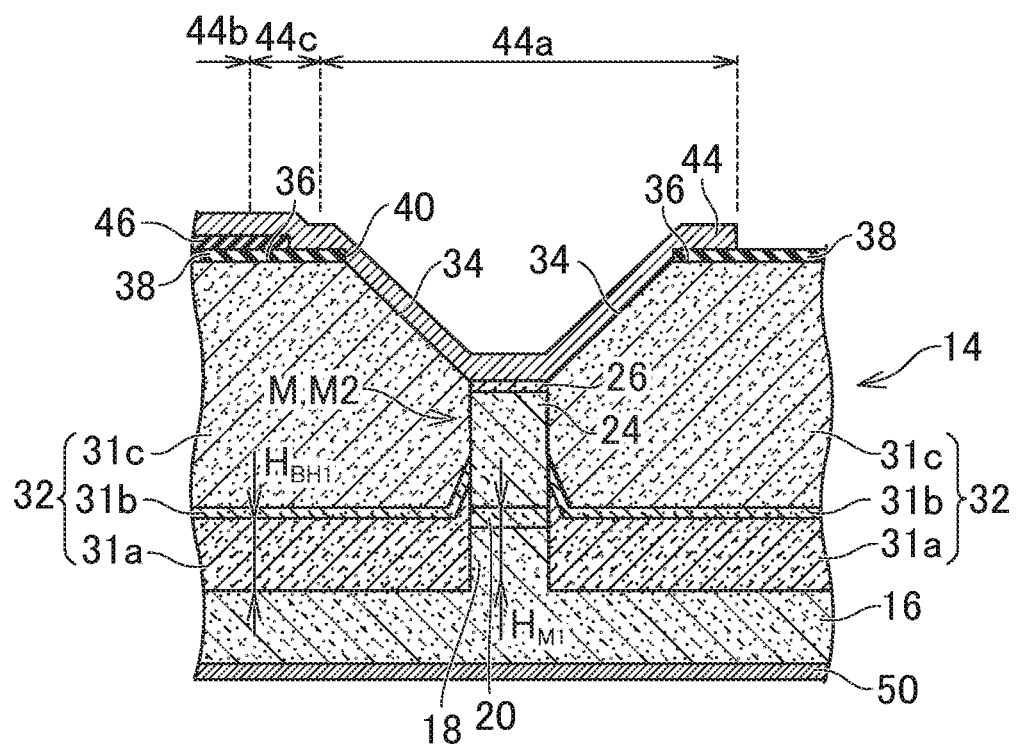
FIG. 4B shows a cross sectional view of a buried semiconductor optical device according to the first example along a III-III line.

FIG. 4A shows a cross sectional view of the buried semiconductor optical device 10 according to an implementation along a I-II line. FIG. 4B shows a cross sectional view of the buried semiconductor optical device 10 according to an implementation along a III-III line.

The buried semiconductor optical device 10 comprises a buried hetero (BH) structure. The BH structure refers to a structure wherein a mesa-stripe structure M including a waveguide is sandwiched between semi-insulating semiconductor layers laterally. The BH structure offers an advantageous effect of high coupling efficiency with an optical fiber because the BH structure strongly confines a light beam laterally, thereby making a far-field pattern (FFP) more circular. Furthermore, the BH structure is widely used because the BH structure exhibits superior heat dissipation property.

The buried semiconductor optical device 10 comprises the semiconductor substrate 16. The semiconductor substrate 16 consists of an n-doped semiconductor (for example n-InP). The semiconductor substrate 16 has a convex portion 18.

The convex portion 18 forms a strip-geometry and extends along a first direction D1. The convex portion 18 forms at least a lower part of the mesa-stripe structure M. The mesa-stripe structure M comprises a first mesa-stripe structure M1 which forms the oscillator 12 (semiconductor laser). The mesa-stripe structure M comprises a second mesa-stripe structure M2 which forms the modulator 14.

The buried semiconductor optical device 10 comprises a multi quantum well (MQW) layer 20 on the convex portion 18. The MQW layer 20 also forms a strip-geometry and extends along the first direction D1. The MQW layer 20 consists of an intrinsic semiconductor (without any n- or p-type dopants). According to some implementations, the MQW layer 20 consists of well layers and associated barrier layers, and a total thickness of the MQW layer 20 is 0.35 μm. The MQW layer 20 forms a part of the mesa-stripe structure M. In the semiconductor laser (the first mesa-stripe structure M1), the MQW layer 20 is an active layer. In the modulator 14 (the second mesa-stripe structure M2), the MQW layer 20 is an absorption layer. When an electric field is applied to the MQW layer in the modulator 14, an optical absorption edge of the MQW layer shifts to a higher wavelength. This phenomenon is called Quantum Confinement Stark Effect (QCSE). The EA modulator makes use of QCSE to modulate light. The MQW layer is sandwiched between light guiding layers (not shown) vertically, which both consist of InGaAsP. It is noted that the MQW layer 20 in the oscillator 12 is different in composition wavelength, thickness of the well layer, and thickness of the barrier layer from the MQW layer 20 in the modulator 14.

In the oscillator 12, a grating layer 22 is deposited on the MQW layer (active layer) 20. The grating layer 22 consists of InGaAsP. The mesa-stripe structure M comprises a cladding layer 24 on the MQW layer 20 (or on the grating layer 22 in the oscillator 12). The cladding layer 24 forms a stripe-shape and extends along the first direction D1. The cladding layer 24 consists of a p-type semiconductor doped with zinc (Zn) (for example, p-InP), which is one of p-type dopants. The mesa-stripe structure M comprises a contact layer 26. The contact layer 26 consists of p-InGaAsP and p-InGaAs layers both doped with Zn, a p-type dopant.

The buried semiconductor optical device 10 comprises a buried layer 32. The buried layer 32 comprises at lease a first buried sublayer 31a, a second buried sublayer 31b, and a third buried sublayer 31c.

The first buried sublayer 31a is a semi-insulating semiconductor InP doped with Ru. The first buried sublayer 31a is disposed on the upper surface of the semiconductor substrate 16.

The buried layer 32 comprises the second buried sublayer 31b on the upper surface of the first buried sublayer 31a. The second buried sublayer 31b is selected from a group consisting of InGaAs, InAlAs, InGaAlAs, InGaAsP, and InAAsP. It is noted that the second buried sublayer 31b has a higher refractive index than that of the first buried sublayer 31a, which consists of InP. Thus, if the second buried sublayer 31b has the same height as that of the MQW layer 20, light guided through the MQW layer 20 spreads over the second buried sublayer 31b. In other words, the MQW layer 20 confines the light less, resulting in degradation of optical property of the oscillator 12. Therefore, the second buried sublayer 31b should be deposited at least after the semi-insulating InP layer fills the MQW layer 20. According to some implementations, the second buried sublayer 31b is undoped.

A thickness of the first buried sublayer 31a, $H_{BH1}$ measured from a flat portion of the buried sublayer 31a apart from the mesa-stripe structure M is equal to or larger than a height of the upper surface of the MQW layer 20 in the mesa-stripe structure, $H_{M1}$. According to some implementations, $H_{BH1}$ is 2 µm.

The buried layer 32 comprises the third buried sublayer 31c on the surface of the second buried sublayer 31b. The third buried sublayer 31c consists of InP doped with Ru as impurity.

The buried layer 32 consists of a first portion and a second portion. The first and second portions are located adjacent to the mesa-stripe structure M along a second direction D2 orthogonal to the first direction D1 so as to form the BH structure.

The buried layer 32 comprises an inclined portion 34 on the upper surface of the buried layer 32. The inclined portion 34 is inclined along (111) orientation, and located adjacent to the upper surface of the mesa-stripe structure M. The buried layer 32 also comprises a flat portion 36 extending parallel to a horizontal plane HP outside of the inclined portion 34.

According to some implementations, the buried layer 32 comprises the second sublayer 31b to react with In to avoid forming In cores in the buried layer 32. As a result, a buried semiconductor optical device with less foreign bodies can be provided.

The mesa-stripe structure M and the buried layer 32 are covered with a passivation layer 38. The passivation layer 38 has a through hole 40 in the passivation layer 38. In the through hole 40, the upper surface of the mesa-stripe structure M (the contact layer 26) and a part of the upper surface of the buried layer 32 (the inclined portion 34) are exposed. An electrode 42 for the oscillator 12 and an electrode 44 for the modulator 14 are disposed on the passivation layer 38. The electrodes 42, 44 are electrically connected to the contact layer 26 in the through hole 40. The electrode 44 comprises an extending portion 44a, a pad 44b and a connecting portion 44c. An insulating film 46 consists of $SiO_2$. The insulating film 46 is disposed between the pad 44b and the passivation layer 38 to reduce the parasitic capacitance of the buried semiconductor optical device 10. The buried semiconductor optical device 10 comprises an antireflecting film on the exit edge face and a high-reflecting film on the opposite edge face to the exit edge face.

In the fabrication process of the buried semiconductor optical device 10, a first crystal growth to form the first mesa-stripe structure M shown in FIG. 4A is performed. Specifically, the light-guiding layer, the MQW layer (active layer) 20 and the grating layer 22 are deposited on the semiconductor substrate 16 via Metal-Organic Chemical Vapor Deposition (MO-CVD). The MQW layer 20 is formed by depositing well layers and barrier layers consisting of InGaAsP, alternately. Composition of InGaAsP in the MQW layer 20 is adjusted such that the MQW layer (active layer) 20 in the oscillator 12 exhibits photoluminescence of wavelength of 1555 nm. A buffer layer may optionally be deposited on the semiconductor substrate 16 prior to the first crystal growth (e.g., as shown in FIG. 6C).

Next, a silicon nitride (SiN) layer is deposited via Plasma Chemical Vapor Deposition, and then patterned such that the patterned SiN layer remains on the area of the first mesa-stripe structure M1. Dry and wet etching is performed by using the patterned SiN layer as an etching mask.

In the fabricating process of the buried semiconductor optical device 10, a second crystal growth to form the second mesa-stripe structure M2 shown in FIG. 3 is performed. Specifically, the light-guiding layer and the MQW layer (absorption layer) 20 are deposited on the semiconductor substrate 16 via MO-CVD. The oscillator 12 is optically connected with the modulator 14 via a pad joint. Composition of InGaAsP in the MQW layer 20 is adjusted such that the MQW layer (absorption layer) 20 in the modulator 14 exhibits photoluminescence of wavelength of 1495 nm. InAsAsP based material is used for the MQW layer 20 in the modulator 14. However, InAsAlAs based material can be used.

Then, a grating in the grating layer 22 of the oscillator 12 is formed via interference exposure method. After the grating is formed, the cladding layer 24 and contact layer 26 are deposited to form a part of the oscillator 12 and modulator 14. Zn is used for p-type dopants.

Next, a silicon dioxide ($SiO_2$) layer is deposited above the mesa-stripe structure M including the oscillator 12 and the modulator 14. Then, dry or wet etching of the semiconductor substrate 16 is performed by using the $SiO_2$ layer as an etching mask to form the mesa-stripe structure M with a width of 1.3 µm. For example, the semiconductor substrate 16 is removed 1.5 µm below the lower surface of the MQW layer 20.

The buried semiconductor optical device 10 comprises the buried layer 32 consisting of a first portion and a second portion, located at both sides of the mesa-stripe structure M. The buried layer 32 comprises at lease the first buried sublayer 31a, the second buried sublayer 31b and the third buried sublayer 31c.

The first buried sublayer 31a consists of InP doped with Ru as impurity and is deposited via MO-CVD. A thickness of the first buried sublayer 31a, $H_{BH1}$ measured from a flat portion of the buried sublayer 31a apart from the mesa-stripe structure M is equal to or larger than a height of the upper surface of the MQW layer 20 in the mesa-stripe structure, $H_M$. According to some implementations, $H_{BH1}$ is 2 µm.

Then, the second buried sublayer 31b consists of InGaAs without any dopants and is deposited via MO-CVD. A thickness of the second buried sublayer 31b is 10 nm. If the thickness of the second buried sublayer 31b is less than 5 nm, foreign bodies may not be suppressed. It may be desirable that the thickness of the second buried sublayer 31b is equal to or more than 5 nm.

Thus, the thickness of the second buried sublayer 31b ranges from 5 nm to a critical thickness with which the second buried sublayer 31b is lattice-matched to the first buried sublayer 31a. Preferably, the thickness of the second buried sublayer 31b is equal to or less than 500 nm in consideration of the critical thickness and fabrication yield of the buried semiconductor optical device. More preferably, the thickness of the second buried sublayer 31b is equal to or less than 50 nm in consideration of optical properties of the buried semiconductor optical device. In the present application, the "critical thickness" of a layer refers to a maximum thickness with which the layer is deposited coherently (i.e., dislocation free).

The second buried sublayer 31b is a layer selected from a group of InGaAs, InAlAs, InGaAlAs, InGaAsP and InAAsP.

Preferably, the second buried sublayer 31b has high resistance without any dopants. However, the second buried sublayer 31b may have electrical conductivity.

It is noted that, if the second buried sublayer 31b is electrically conductive, the second buried sublayer 31b has the opposite conductivity to a conductivity type of the cladding layer 24. Dopants such as Ru or Fe may be added to the second buried sublayer 31b.

Then, the third buried sublayer 31c consists of InP doped with Ru as impurity and is deposited via MO-CVD. The third buried sublayer 31c consists of first and second portions. The first and second portions are located at both sides of the mesa-stripe structure M. A thickness of the third buried sublayer 31c is 4 μm.

According to some implementations, the buried semiconductor optical device 10 comprises the second buried sublayer 31b in the buried layer 32 to react with In to avoid formation of In cores in the buried layer 32. As a result, a buried semiconductor optical device with less foreign bodies can be provided.

The passivation layer 38 is deposited on the whole surface of the wafer. The insulating film 46 consists of $SiO_2$ and is deposited such that the insulating film 46 covers an area of the pad 44b of the electrode 44 in the modulator 14. The insulating film 46 reduces parasitic capacitance of the buried semiconductor optical device 10. Then, in the oscillator 12 and modulator 14, the passivation layer 38 is partially removed via wet etching such that the through hole 40 is formed. The electrodes 42, 44 are deposited via electron beam deposition and ion milling such that the electrodes 42, 44 cover the respective through holes 40 in the oscillator 12 and modulator 14.

As a final process of the wafer, a bottom surface of the wafer is polished until the thickness of the wafer is about 100 μm. and an electrode 50 is deposited on the bottom surface. The wafer is cleaved such that the wafer is divided into bars. An anti-reflection coating is deposited on an edge of the modulator 14 and a high-reflection coating is deposited on an edge of the oscillator 12. Then each bar is divided into chips, resulting in the buried semiconductor optical device 10.

Figure 1:
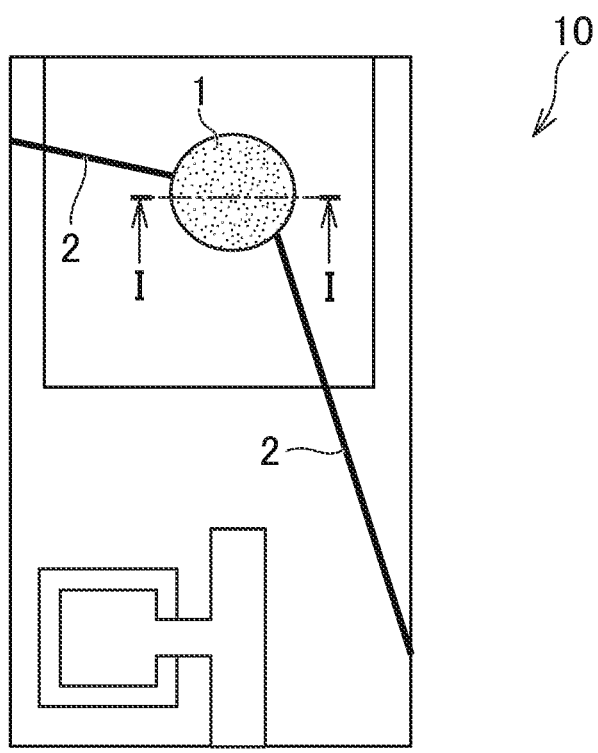
FIG. 1 schematically shows a plan view of foreign bodies and associated cracks.
Figure 2:
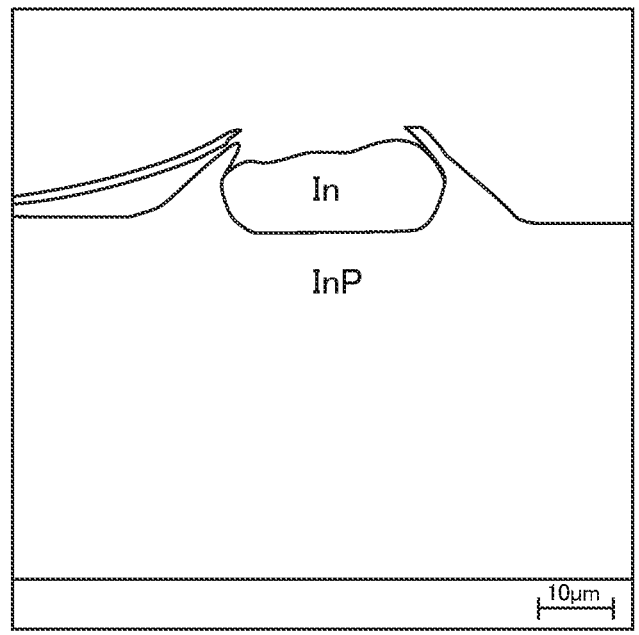
FIG. 2 schematically illustrates a cross-section of the foreign bodies and the buried semiconductor optical device along a I-I line with composition of the foreign bodies and the buried semiconductor optical device obtained with an electron microscope.

A mechanism of suppressing foreign bodies by the second buried sublayer 31b will be described below. As explained in FIGS. 1 and 2, the unreacted In persists as the In cores in the process of depositing the InP buried layer, and the In cores mainly become the foreign bodies. The thicker the InP buried layer becomes, the larger the In cores get. Such larger In cores would disturb the cleavage. In the process of depositing InP, the second buried sublayer 31b is deposited, which is selected from a group of InGaAs, InAlAs, InGaAlAs, InGaAsP and InAAsP, which reacts with In more. The unreacted In (or In cores) are incorporated into the second buried sublayer 31b. As a result, the In cores (foreign bodies) are suppressed. InP thickness above 5 mm may increase foreign bodies thereby reducing production yield of the buried semiconductor optical device through their studies. Thus, InP thickness needs to be equal to or less than 5 μm. It is noted that InP thickness may be equal to or less than 3.5 μm inconsideration of production variation within a plane of the wafer to offer higher production yield of the buried semiconductor optical device.

A buried semiconductor optical device including a buried layer consisting of InP doped with Ru is provided as a comparative example. In the comparative example, a thickness of the buried layer is 6 μm. In the buried semiconductor optical device according to the comparative example, some hundreds of foreign bodies can be found through a metal microscope installed around a wafer. In the buried semiconductor optical device according to some implementations, although the total thickness of the buried layer is about 6 μm, only some tens foreign bodies can be found, which means reduction of the number of foreign bodies to about 10%. Although it may be assumed that the above-mentioned theory can support how the foreign bodies can be suppressed, it is noted that other mechanisms could explain how the foreign bodies can be suppressed. Regardless of the above-mentioned theory, the second buried sublayer 31b can suppress the foreign bodies.

Figure 5A:
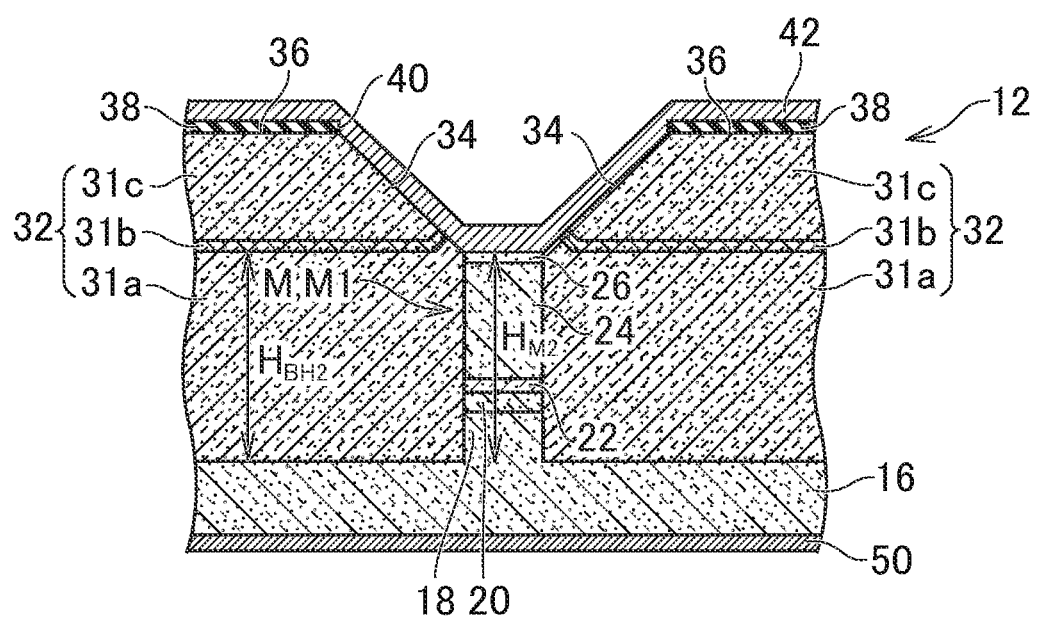
FIG. 5A shows a cross sectional view of a buried semiconductor optical device according to a second example along a II-II line.
Figure 5B:
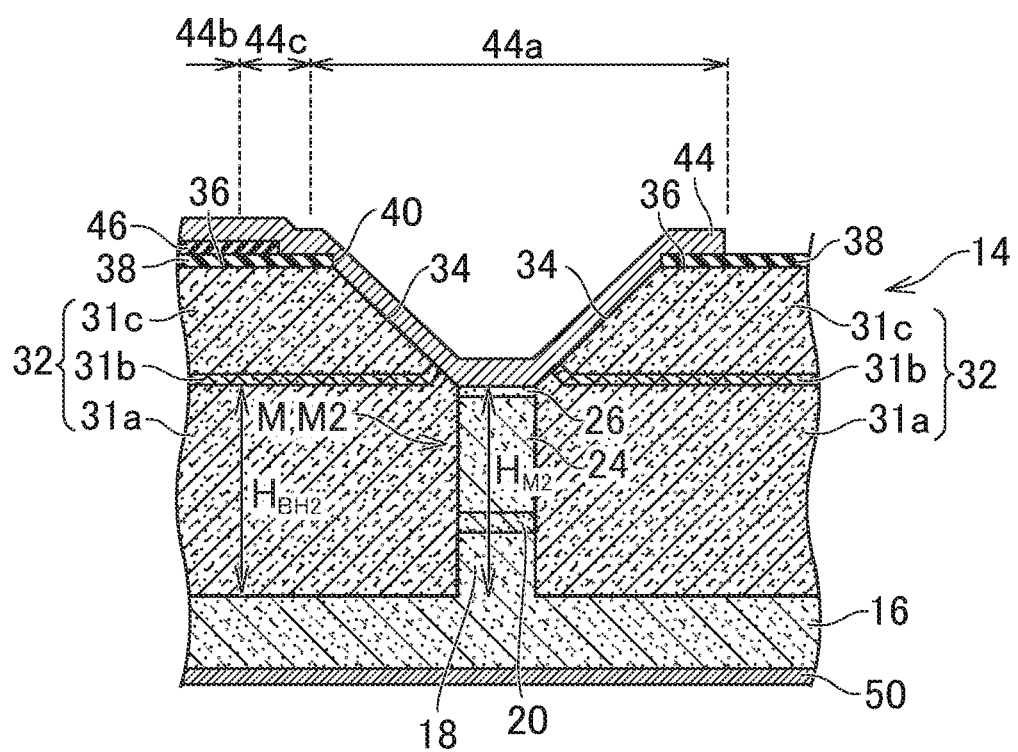
FIG. 5B shows a cross sectional view of a buried semiconductor optical device according to the second example along a III-III line.

FIG. 5A shows a cross sectional view of a buried semiconductor optical device according to an implementation along a I-II line. FIG. 5B shows a cross sectional view of a buried semiconductor optical device according to an implementation along a III-III line. This implementation is similar to a previous implementation except for their positions of the second buried sublayer 31b.

The buried semiconductor optical device 10 comprises the buried layer 32. The buried layer 32 comprises at least the first buried sublayer 31a, the second buried sublayer 31b and the third buried sublayer 31c.

The first buried sublayer 31a is a semi-insulating InP doped with Ru. The first buried sublayer 31a is disposed on the upper surface of the semiconductor substrate 16.

The buried layer 32 comprises the second buried sublayer 31b on the upper surface of the first buried sublayer 31a. The second buried sublayer 31b is selected from a group consisting of InGaAs, InAlAs, InGaAAs, InGaAsP, and InAAsP. A thickness of the second buried sublayer 31b is 10 nm, and an n-type semiconductor layer doped with Si.

A thickness of the first buried sublayer 31a, $H_{BH2}$ measured from a flat portion of the buried sublayer 31a apart from the mesa-stripe structure M is equal to or larger than a height of the upper surface of the MQW layer 20 in the mesa-stripe structure, $H_{M2}$. In other words, the second buried sublayer 31b is located above the top of the mesa-stripe structure M. According to some implementations, $H_{BH2}$ is 3.5 μm.

The buried layer 32 also comprises the third buried sublayer 31c on the upper surface of the second buried sublayer 31b. The third buried sublayer 31c consists of InP doped with Ru. A thickness of the third buried sublayer 31c is 2.5 μm.

According to some implementations, the buried semiconductor optical device 10 comprises the second buried sublayer 31b in the buried layer 32 to react with In to avoid formation of In cores in the buried layer 32. As a result, a buried semiconductor optical device with less foreign bodies can be provided. Furthermore, the second buried sublayer 31b may be more distant from the MQW layer 20 than in a previous implementation. As a result, this implementation may achieve stronger confinement of light within the MQW layer 20.

Figure 6A:
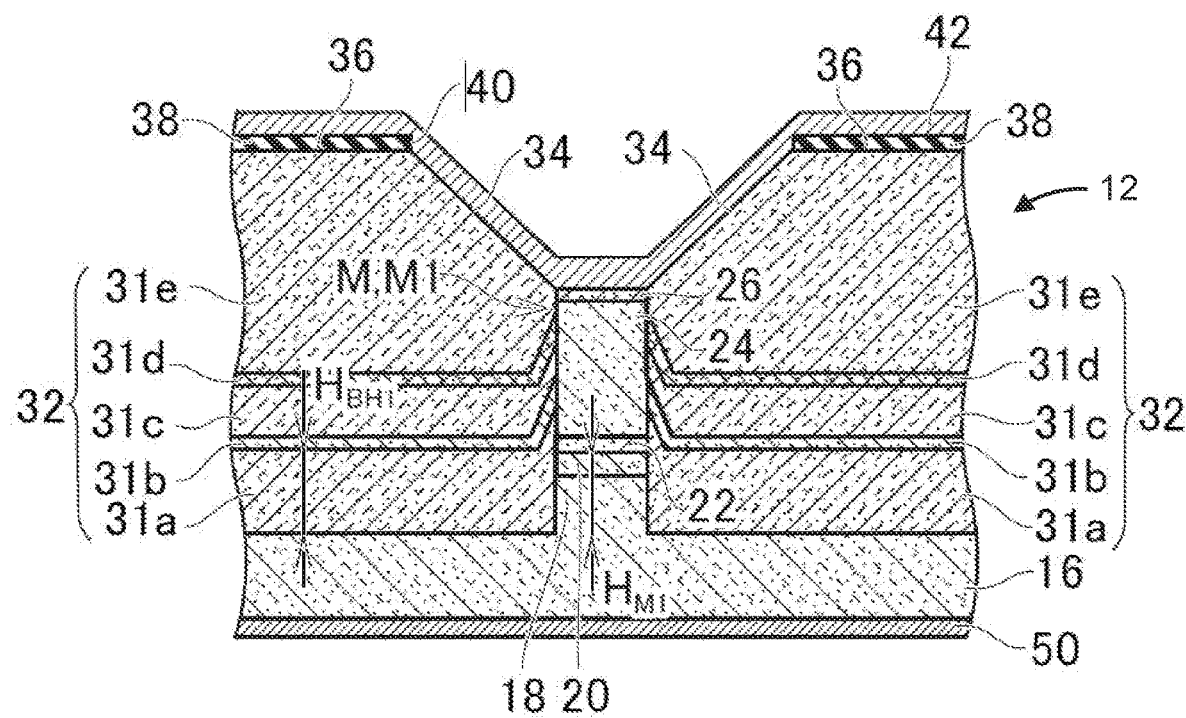
FIG. 6A shows a cross sectional view of a buried semiconductor optical device according to a third example along a II-II line.
Figure 6B:
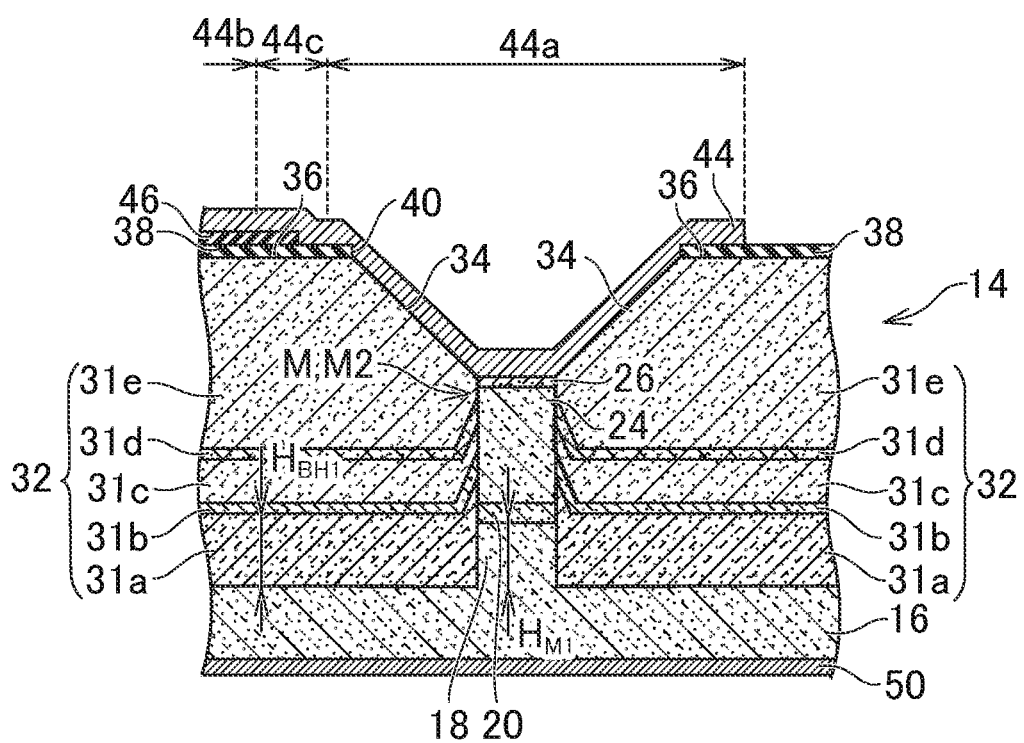
FIG. 6B shows a cross sectional view of a buried semiconductor optical device according to the third example along a III-III line.
Figure 6C:
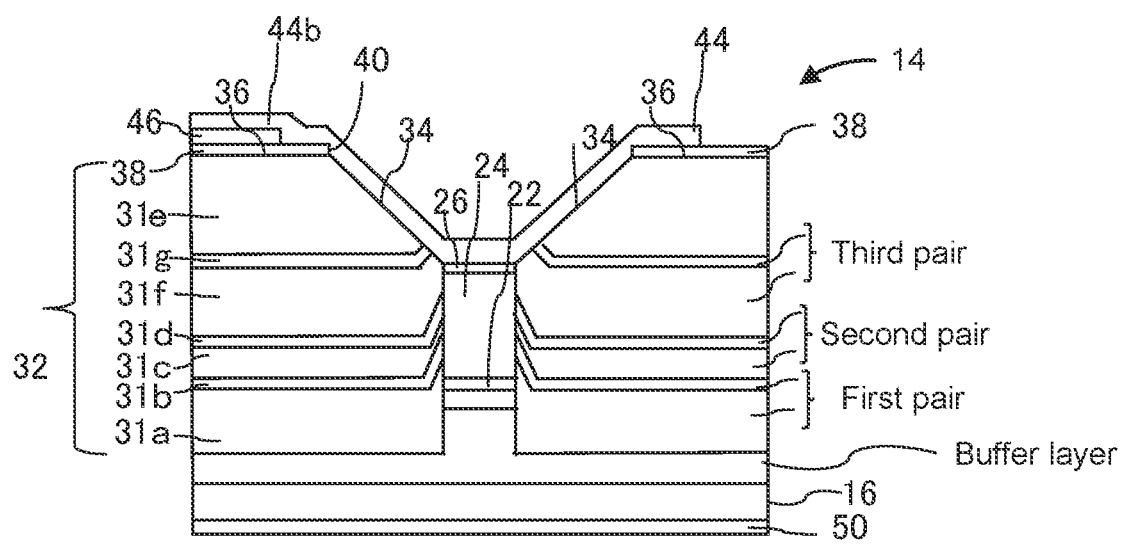
FIG. 6C shows another cross sectional view of a buried semiconductor optical device according to the third example along a III-III line.

FIG. 6A shows a cross sectional view of the buried semiconductor optical device 10 according to an implementation along a II-II line. FIG. 6B shows a cross sectional view of the buried semiconductor optical device 10 according to an implementation along a line. FIG. 6C shows another cross sectional view of the buried semiconductor optical device 10 according to the third example along a line. This implementation is similar to a previous except for aspects of the second buried sublayer 31b.

The buried semiconductor optical device 10 comprises the buried layer 32. The buried layer 32 comprises at least the first buried sublayer 31a, the second buried sublayer 31b, the third buried sublayer 31c, a fourth buried sublayer 31d and a fifth buried sublayer 31e. The first and second sublayers 31a, 31b, and third and fourth sublayers 31c, 31d form the respective pair structures.

The first buried sublayer 31a is a semi-insulating InP doped with Ru. The first buried sublayer 31a is disposed on the upper surface of the semiconductor substrate 16.

The buried layer 32 comprises the second buried sublayer 31b on the upper surface of the first buried sublayer 31a. The second buried sublayer 31b is selected from a group consisting of InGaAs, InAlAs, InGaAlAs, InGaAsP, and InAlAsP. A thickness of the second buried sublayer 31b is 5 nm, and is undoped. Similar to a previous implementation, the second buried sublayer 31b should be deposited at least after the semi-insulating InP layer fills the MQW layer 20.

A thickness of the first buried sublayer 31a, $H_{BH1}$ measured from a flat portion of the buried sublayer 31a apart from the mesa-stripe structure M is equal to or larger than a height of the upper surface of the MQW layer 20 in the mesa-stripe structure, $H_M$. According to some implementations, $H_{BH2}$ is 2 μm.

The buried layer 32 also comprises the third buried sublayer 31c on the upper surface of the second buried sublayer 31b. The third buried sublayer 31c consists of InP doped with Ru. A thickness of the third buried sublayer 31c is 2 μm.

The buried layer 32 comprises the fourth buried sublayer 31d on the upper surface of the third buried sublayer 31c. The fourth buried sublayer 31d is selected from a group consisting of InGaAs, InAlAs, InGaAAs, InGaAsP, and InAAsP. A thickness of the fourth buried sublayer 31d is 5 nm, and is undoped.

The buried layer 32 also comprises the fifth buried sublayer 31e on the upper surface of the second buried sublayer 31b. The fifth buried sublayer 31e consists of InP doped with Ru. A thickness of the fifth buried sublayer 31e is 2 μm.

According to some implementations, the buried semiconductor optical device 10 comprises the second buried sublayer 31b and the fourth buried sublayer 31d in the buried layer 32 to react with Into avoid formation of In cores in the buried layer 32. As a result, a buried semiconductor optical device with less foreign bodies can be provided. According to some implementations, unreacted In, which would become foreign bodies, is incorporated not only into the second buried sublayer 31b but also into the fourth buried sublayer 31d, resulting in further suppression of the foreign bodies.

Although the buried layer 32 comprises the first buried sublayer 31a, the second buried sublayer 31b, the third buried sublayer 31c, the fourth buried sublayer 31d and the fifth buried sublayer 31e according to some implementations, the buried layer 32 comprises two or more pair structures, each pair structure consisting of the first buried sublayer 31a and the second buried sublayer 31b. For example, the buried layer 32 may include a third pair structure, comprising a sixth buried sublayer 31f and a seventh buried sublayer 31g. Each second buried sublayer in each pair structure is different in composition.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:
1. A buried semiconductor optical device comprising:
a semiconductor substrate;
a mesa-stripe portion including a multi-quantum well layer on the semiconductor substrate;
a buried layer consisting of a first portion and a second portion,
the first portion covering one side of the mesa-stripe portion,
the second portion covering the other side of the mesa-stripe portion, and
the first portion and the second portion covering a surface of the semiconductor substrate; and
an electrode configured to cause an electric current to flow through the mesa-stripe portion,
the buried layer comprising, from the surface of the semiconductor substrate, a first sublayer, a second sublayer, and a third sublayer,
the first sublayer, and the third sublayer each consisting of semi-insulating InP,
the first sublayer and the second sublayer forming a pair structure,
the first sublayer being a bottom layer of the buried layer;
the second sublayer being located above the multi-quantum well layer from the surface of the semiconductor substrate, and
the second sublayer consisting of one or more layers selected from a group of InGaAs, InAlAs, InGaAlAs, InGaAsP, and InAlAsP.

2. The buried semiconductor optical device of claim 1, wherein the second sublayer is located above a top of the mesa-stripe portion.

3. The buried semiconductor optical device of claim 1, wherein the first sublayer has a thickness equal or less than 5 μm.

4. The buried semiconductor optical device of claim 1, wherein the second sublayer has a thickness equal or more than 5 nm.

5. The buried semiconductor optical device of claim 1, wherein the second sublayer is lattice-matched to the first sublayer.

6. The buried semiconductor optical device of claim 1, wherein the first sublayer and the third sublayer are InP doped with Fe or Ru.

7. The buried semiconductor optical device of claim 1, wherein the second sublayer includes no impurities which make the second sublayer a p-type or n-type semiconductor.

8. The buried semiconductor optical device of claim 1 wherein the second sublayer is doped with Ru.

9. The buried semiconductor optical device of claim 1, further comprising:

a buffer layer disposed on the semiconductor substrate.

10. The buried semiconductor optical device of claim 1, wherein the pair structure comprises a plurality of pair structures.

11. The buried semiconductor optical device of claim 10, wherein each of second sublayers of the plurality of pair structures consists of one or more layers selected from InGaAs, InAlAs, InGaAlAs, InGaAsP, and InAlAsP, and at least one of the second sublayers is different in composition from the rest of the second sublayers.

12. The buried semiconductor optical device of claim 10, wherein the plurality of pair structures comprises three or more pair structures.

* * * * *